(12) United States Patent
Lim et al.

(10) Patent No.: US 8,975,812 B2
(45) Date of Patent: Mar. 10, 2015

(54) POLARIZATION STRUCTURE, METHOD OF MANUFACTURING A POLARIZATION STRUCTURE AND ORGANIC LIGHT EMITTING DISPLAY DEVICE HAVING A POLARIZATION STRUCTURE

(75) Inventors: Jae-Ik Lim, Yongin (KR); Man-Seob Choi, Yongin (KR); Yi-Joon Ahn, Yongin (KR); Gee-Bum Kim, Yongin (KR); Yong-Seok Yeo, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 142 days.

(21) Appl. No.: 13/615,326

(22) Filed: Sep. 13, 2012

(65) Prior Publication Data

US 2013/0140587 A1     Jun. 6, 2013

(30) Foreign Application Priority Data

Dec. 1, 2011     (KR) ........................ 10-2011-0127499

(51) Int. Cl.
*H01L 27/32*     (2006.01)
*G02B 5/30*     (2006.01)

(52) U.S. Cl.
USPC ........................................... 313/501; 313/507

(58) Field of Classification Search
USPC .................................... 313/498–512; 257/88
See application file for complete search history.

(56) References Cited

U.S. PATENT DOCUMENTS

| | | | | |
|---|---|---|---|---|
| 2005/0128394 A1* | 6/2005 | Lee et al. | | 349/119 |
| 2005/0225707 A1* | 10/2005 | Seo et al. | | 349/122 |
| 2005/0269020 A1 | 12/2005 | Matsuoka | | |
| 2010/0214264 A1* | 8/2010 | Kuo et al. | | 345/174 |
| 2010/0285714 A1* | 11/2010 | Kim et al. | | 445/24 |
| 2011/0176092 A1* | 7/2011 | Iida et al. | | 349/96 |

FOREIGN PATENT DOCUMENTS

| | | |
|---|---|---|
| JP | 2005-338215 A | 12/2005 |
| KR | 10-2009-0117641 A | 11/2009 |
| KR | 10-2010-0078259 A | 7/2010 |

* cited by examiner

*Primary Examiner* — Tracie Y Green
(74) *Attorney, Agent, or Firm* — Knobbe, Martens, Olson & Bear, LLP

(57) ABSTRACT

A polarization structure for a display device is disclosed. In one embodiment, the structure includes a retardation layer, a first polarizing layer, a first uniaxial optical compensation layer, a second polarizing layer and a second uniaxial optical compensation layer. The retardation layer may be configured to create a phase difference between two polarization components of an incident light. The first polarizing layer may be disposed on the retardation layer. The first uniaxial optical compensation layer may be disposed on the first polarizing layer. The second polarizing layer may be disposed on the first uniaxial optical compensation layer. The second uniaxial optical compensation layer may be disposed between the first polarizing layer and the first uniaxial optical compensation layer or between the first polarizing layer and the second polarizing layer.

21 Claims, 6 Drawing Sheets

POLARIZATION STRUCTURE, METHOD OF MANUFACTURING A POLARIZATION STRUCTURE AND ORGANIC LIGHT EMITTING DISPLAY DEVICE HAVING A POLARIZATION STRUCTURE

CROSS-REFERENCE TO RELATED APPLICATION

This application claims priority under 35 USC §119 to Korean Patent Application No. 10-2011-0127499 filed on Dec. 1, 2011 in the Korean Intellectual Property Office (KIPO), the contents of which are herein incorporated by reference in its entirety.

BACKGROUND

1. Field

The described technology generally relates to a polarization structure, a method of manufacturing the same and an organic light emitting display including the structure.

2. Description of the Related Technology

An organic light emitting diode (OLED) display can display desired information such as images, letters and/or characters using a light generated by combining holes provided from an anode with electrons provided from a cathode in an organic layer thereof. Flat panel displays typically include liquid crystal displays, plasma display panels, field emission displays and OLED displays. Among them, OLED displays have been widely used across a large gamut of products ranging from a portable display such as a cell phone, a smart phone or an MP3 player to a larger display such as a flat panel TV, because they provide many advantages such as a relatively large viewing angle, a fast response speed, a thin profile and low power consumption. Accordingly, OLED technology is considered to be one of the most promising next-generation displays.

SUMMARY

One inventive aspect is a polarization structure having a simplified structure and desired optical characteristics.

Another aspect is a method of manufacturing a polarization structure having a simplified structure and desired optical characteristics.

Another aspect is an organic light emitting display including a polarization structure having a simplified structure and desired optical characteristics.

Another aspect is a polarization structure including a retardation layer, a first polarizing layer, a first uniaxial optical compensation layer, a second polarizing layer and a second uniaxial optical compensation layer. The retardation layer may be configured to create a phase difference between two polarization components of an incident light. The first polarizing layer may be disposed over the retardation layer. The first uniaxial optical compensation layer may be disposed on the first polarizing layer. The second polarizing layer may be disposed over the first uniaxial optical compensation layer. The second uniaxial optical compensation layer may be disposed between the first polarizing layer and the first uniaxial optical compensation layer or between the first polarizing layer and the second polarizing layer.

The first uniaxial optical compensation layer may include an O-plate, and the second uniaxial optical compensation layer may include a coatable O-plate. A direction of a slow axis of the O-plate may be substantially perpendicular to that of the coatable O-plate.

The first uniaxial optical compensation layer may include an A-plate, and the second uniaxial optical compensation layer may include a coatable A-plate. A direction of a slow axis of the A-plate may be substantially perpendicular to that of the coatable A-plate.

The first uniaxial optical compensation layer may include a C-plate, and the second uniaxial optical compensation layer may include a coatable C-plate.

The polarization structure may further include a transparent layer disposed between the first uniaxial optical compensation layer and the second uniaxial optical compensation layer, and each of the first uniaxial optical compensation layer and the second uniaxial optical compensation layer may include a coatable plate.

The polarization structure may further include an adhesive layer disposed on a first surface of the retardation layer, a first protection layer disposed between a second surface of the retardation layer and the first polarizing layer, and a second protection layer disposed on the second polarizing layer. The second surface of the retardation layer is opposing the first surface of the retardation layer.

The retardation layer may include a coatable inverse wavelength dispersion type retardation layer, and may be configured to create a phase difference corresponding to a quarter wavelength of the incident light.

The second uniaxial optical compensation layer may have a thickness of about 0.1 μm to about 0.5 μm, and the retardation layer may have a thickness of about 0.1 μm to about 0.5 μm. Each of the first protection layer and the second protection layer may have a thickness less than about 20 μm.

A polarization axis of the first polarizing layer and a polarization axis of the second polarizing layer may be substantially parallel to each other.

The retardation layer may include cyclo-olefin polymer, triacetyl cellulose, polycarbonate, cyclo-olefin copolymer, etc. Each of the first uniaxial optical compensation layer and the second uniaxial optical compensation layer may include cyclo-olefin polymer, triacetyl cellulose, polycarbonate, cyclo-olefin copolymer, etc.

Another aspect is an organic light emitting display including an organic light emitting display panel and a polarization structure. The organic light emitting display panel may include a substrate, a switching structure, a first electrode, a light emitting structure and a second electrode. The polarization structure may include a retardation layer, a first polarizing layer, a first uniaxial optical compensation layer, a second polarizing layer and a second uniaxial optical compensation layer. The retardation layer may be configured to create a phase difference between two polarization components of an incident light. The first polarizing layer may be disposed over the retardation layer. The first uniaxial optical compensation layer may be disposed on the first polarizing layer. The second polarizing layer may be disposed over the first uniaxial optical compensation layer. The second uniaxial optical compensation layer may be disposed between the first polarizing layer and the first uniaxial optical compensation layer or between the first polarizing layer and the second polarizing layer.

The first uniaxial optical compensation layer may include an O-plate, and the second uniaxial optical compensation layer may include a coatable O-plate. A direction of a slow axis of the O-plate may be substantially perpendicular to that of the coatable O-plate.

The first uniaxial optical compensation layer may include an A-plate, and the second uniaxial optical compensation layer may include a coatable A-plate. A direction of a slow axis of the A-plate may be substantially perpendicular to that of the coatable A-plate.

The first uniaxial optical compensation layer may include a C-plate, and the second uniaxial optical compensation layer may include a coatable C-plate.

The retardation layer may include a coatable inverse wavelength dispersion type retardation layer, and may be configured to create a phase difference corresponding to a quarter wavelength of the incident light.

A polarization axis of the first polarizing layer and a polarization axis of the second polarizing layer may be substantially parallel to each other. The second uniaxial optical compensation layer may have a thickness of about 0.1 µm to about 0.5 µm, and the retardation layer has a thickness of about 0.1 µm to about 0.5 µm.

The organic light emitting display may further include an adhesive layer disposed on the first surface of the retardation layer, a first protection layer disposed between a second surface of the retardation layer and the first polarizing layer, and a second protection layer disposed on the second polarizing layer. The second surface of the retardation layer is opposing the first surface of the retardation layer.

Another aspect is a method of manufacturing a polarization structure. In the method, a first protection layer may be laminated on a first surface of a first polarizing layer. A retardation layer may be formed on a surface of the first protection layer through a coating process. A second uniaxial optical compensation layer may be formed on one of two opposing surfaces of a first uniaxial optical compensation layer through a coating process. The first uniaxial optical compensation layer and the second uniaxial optical compensation layer may be laminated on a second surface of the first polarizing layer. A second polarizing layer and a second protection layer may be laminated on the first uniaxial optical compensation layer or the second uniaxial optical compensation layer. The second surface of the first polarizing layer is opposing the first surface of the first polarizing layer.

The first uniaxial optical compensation layer may be formed to include an O-plate, and the second uniaxial optical compensation layer may be formed to include a coatable O-plate.

The forming of the second uniaxial optical compensation layer may include dropping a coating solution on one of two opposing surfaces of the first uniaxial optical compensation layer via a coater and drying the coating solution in a dry zone via ultraviolet radiation. A direction of a slow axis of the first uniaxial optical compensation layer may be substantially perpendicular to a direction of a slow axis of the second uniaxial optical compensation layer.

Prior to the laminating of the second polarizing layer and the second protection layer, a base layer may be laminated on the second protection layer. After the laminating of the second polarizing layer and the second protection layer, the base layer may be removed from the second protection layer.

The polarization structure may substantially prevent or reduce a reflection of an external light, and may substantially prevent or reduce a color shift phenomenon according to an increase in the viewing angle. The polarization structure may include a coatable retardation layer and a coatable uniaxial optical compensation layer, so that the polarization structure may have a smaller thickness than the conventional polarization structure. Therefore, the color shift phenomenon may be substantially prevented or reduced. In a method of manufacturing the polarization structure, an additional base layer may be used to support a polarizing layer, so that the polarization structure including protection layer having a relatively small thickness may be manufactured.

DETAILED DESCRIPTION OF EMBODIMENTS

Figure 1:
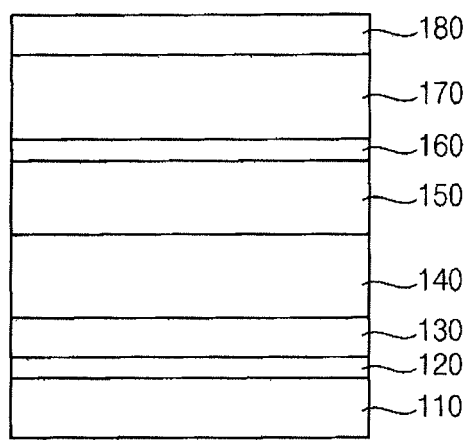
FIG. 1 is a cross-sectional view illustrating a polarization structure in accordance with one embodiment.

Generally, an OLED display includes a polarization structure having a polarizing layer in order to prevent or reduce the degradation of a contrast ratio which may be caused by the combination of a light generated in an organic light emitting display panel and an external light reflected on the organic light emitting display panel. However, when the polarization structure has a relatively large thickness, a color shift phenomenon according to an increase in the viewing angle may degrade the quality of an image. Therefore, the polarization structure may need to be simplified, and the thickness of the polarization structure may need to be reduced.

Various embodiments will be described more fully hereinafter with reference to the accompanying drawings, in which some embodiments are shown. The present disclosure may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a polarization structure in accordance with one embodiment.

Referring to FIG. 1, a polarization structure 100 may include an adhesive layer 110, a retardation layer 120, a first protection layer 130, at least one polarizing layer, at least one uniaxial optical compensation layer, a second protection layer 180, etc. The polarizing layer may include a first polarizing layer 140 and a second polarizing layer 170, and the uniaxial optical compensation layer may include a first uniaxial optical compensation layer 150 and a second uniaxial optical compensation layer 160. In this case, the first uniaxial optical compensation layer 150 may include an O-plate, and the second uniaxial optical compensation layer 160 may include a coatable O-plate.

The adhesive layer 110 may fix the polarization structure 100 on a display panel (not illustrated) of a display device such as an organic light emitting display. The adhesive layer 110 may include a pressure sensitive adhesive. Examples of the pressure sensitive adhesive may include a rubber-based adhesive, an acryl-based adhesive, a vinyl ester-based adhesive, a silicon-based adhesive and/or a urethane-based adhesive. In case that the adhesive layer 110 may include the pressure sensitive adhesive, an adhesion strength between the display panel and the polarization structure 100 may increase while applying a pressure onto the adhesive layer 110. For example, the adhesive layer may have a thickness of about 5 μm to about 25 μm.

The retardation layer 120 may be disposed on the adhesive layer 110. The retardation layer 120 may be coated on the adhesive layer 110. For example, the retardation layer 120 may include a birefringent film containing polymer such as polystyrene, polycarbonate, polyvinylalcohol, polypropylene, polymethylmethacrylate, polyolefine, polyarylate, polyamide, cyclo-olefin polymer, cyclo-olefin copolymer, etc., an alignment film of liquid crystal polymer and/or an alignment layer containing liquid crystal polymer.

The retardation layer 120 may ensure a phase difference between two polarization components of light incident thereto. The retardation layer 120 may include an inverse wavelength dispersion type retardation film. As for the inverse wavelength dispersion type retardation film, a phase difference between two polarization components substantially perpendicular to each other may be substantially proportional to a wavelength of the incident light. Therefore, when using the inverse wavelength dispersion type retardation film, a desirable phase difference corresponding to a quarter wavelength of the incident light may be obtained in a relatively large range of the wavelength of the incident light. That is, the inverse wavelength dispersion type retardation film may convert a linearly polarized light into a circularly polarized light or may convert a circularly polarized light into a linearly polarized light in the relatively large range of the wavelength.

The retardation layer 120 may be coated on the adhesive layer 110, so that the retardation layer 120 may have a reduced thickness. For example, the retardation layer 120 coated on the adhesive layer 110 may have a relatively small thickness of about 0.1 μm to about 5.0 μm.

The first protection layer 130 may be disposed on the retardation layer 120. The first protection layer 130 may protect or support the first polarizing layer 140 disposed thereon. The first protection layer 130 may include an optically isotropic film that may not substantially change polarization characteristics of the incident light. For example, the first protection layer 130 may include triacetyl cellulose, cyclo-olefin polymer, polyethyleneterephthalate, polypropylene, polycarbonate, polysulfone and/or polymethyl methacrylate. The first protection layer 130 may have a relatively small thickness below about 20 μm, so that the polarization structure 100 may have a reduced thickness. Alternatively, the first protection layer 130 may have a relatively large thickness in the range of about 20 μm to about 80 μm.

The first polarizing layer 140 may be disposed on the first protection layer 130. The first polarizing layer 140 may allow a polarization component of the incident light having a specific direction to pass therethrough. For example, the first polarizing layer 140 may include an iodine-based material, a dye-containing material and/or a polyene-based material. The first polarizing layer 140 may have a polarity due to iodine ion chains aligned with a stretched polyvinyl alcohol film. In one embodiment, the first polarizing layer 140 has a polarity due to dichroic dyes aligned with a stretched polyvinyl alcohol film. In another embodiment, the first polarizing layer 140 has a polarity due to the polyene-based material generated by a dehydration of a polyvinyl alcohol or a dehydrochloration of a polyvinyl chloride.

The first polarizing layer 140 may have a polarization axis and an adsorption axis. The adsorption axis may substantially correspond to an axis in which the iodine ion chains or the dichroic dyes may be aligned. In this case, a polarization component of the incident light which may vibrate along a direction of the adsorption axis may be dissipated because of an interaction with an electron in the first polarizing layer 140. The polarization axis may be substantially perpendicular to the adsorption axis, and may allow a polarization component of the incident light to pass therethrough, which may vibrate along a direction of the polarization axis.

The first polarizing layer 140 obtained by a stretching process may be easily contracted or deformed at a room temperature. The first protection layer 130 may support the first polarizing layer 140, so that the first polarizing layer 140 may not be deformed. The first polarizing layer 140 may have a thickness of about 15 μm to about 30 μm.

The first uniaxial optical compensation layer 150 may be positioned on the first polarizing layer 140. The first uniaxial optical compensation layer 150 may include the O-plate. In this case, the first uniaxial optical compensation layer 150 may convert a linearly polarized light into a circularly polarized light or to convert a circularly polarized light into a linearly polarized light. A direction substantially perpendicular to a surface of the O-plate may be defined as a Z-axis direction, and a direction substantially perpendicular to the Z-axis direction and substantially parallel to the surface of the O-plate may be defined as an X-axis direction. Further, a direction substantially perpendicular to the X-axis direction and the Z-axis direction may be defined and a Y-axis direction. When a refractive index in the X-axis direction is defined as nX, a refractive index in the y-axis direction is defined as nY, and a refractive index in the z-axis direction is defined as nZ, the O-plate may satisfy an equation of $nX \neq nY \neq nZ$. That is, the O-plate may have a uniaxial anisotropy, and an optical axis of the O-plate may be neither substantially perpendicular to nor substantially parallel to the X-axis direction, the Y-axis direction and the Z-axis direction. When the first uniaxial optical compensation layer 150 includes the O-plate, the O-plate may include cyclo-olefin polymer, triacetyl cellulose, polycarbonate and/or cyclo-olefin copolymer. In case that the O-plate may include cyclo-olefin polymer, the polarization structure 100 may ensure a desired reliability in a relatively high temperature under high humidity environment. For example, the first uniaxial optical compensation layer 150 may have a relatively large thickness of about 10 μm to about 50 μm.

As illustrated in FIG. 1, the second uniaxial optical compensation layer 160 may be disposed on the first uniaxial optical compensation layer 150, and may include a coatable O-plate. For example, the second uniaxial optical compensation layer 160 may be coated on the first uniaxial optical compensation layer 150. As for the coatable O-plate of the second uniaxial optical compensation layer 160, when refractive indices in the x-axis direction, the y-axis direction and the z-axis direction are defined as nX, nY and nZ, and the coatable O-plate may satisfy an equation of $nX \neq nY \neq nZ$. That is, the coatable O-plate may have a uniaxial anisotropy, and an optical axis of the coatable O-plate may be neither substantially perpendicular to nor substantially parallel to the X-axis direction, the Y-axis direction and the Z-axis direction. The coatable O-plate may include triacetyl cellulose (TAC), cyclo-olefin polymer, polycarbonate and/or cyclo-olefin copolymer.

A slow axis of the coatable O-plate of the second uniaxial optical compensation layer 160 may be substantially perpendicular to a slow axis of the O-plate of the first uniaxial optical compensation layer 150. For example, when the slow axis of the coatable O-plate has an angle of about 90 degrees relative to the X-axis, the slow axis of the O-plate may have an angle of about 0 degree with respect to the X-axis. The second uniaxial optical compensation layer 160 may have a relatively small thickness of about 0.1 μm to about 5.0 μm.

The coatable O-plate of the second uniaxial optical compensation layer 160 may be coated on the O-plate of the first uniaxial optical compensation layer 150, so that a thickness of the second uniaxial optical compensation layer 160 may be reduced. For example, the second uniaxial optical compensation layer 160 may have a relatively small thickness of about 0.1 μm to about 0.5 μm. The coatable O-plate may easily adhere to the O-plate, so that an additional adhesive layer for binding the coatable O-plate and the O-plate may not be necessary. That is, an additional adhesive layer for binding the second uniaxial optical compensation layer 160 with the first uniaxial optical compensation layer 150 may not be required.

The second polarizing layer 170 may be disposed on the second uniaxial optical compensation layer 160. The second polarizing layer 170 may allow a polarization component of the incident light having a specific direction to pass therethrough. The second polarizing layer 170 may include a material substantially the same as or substantially similar to that of the first polarizing layer 140, and thus detailed descriptions thereof will be omitted. The second polarizing layer 170 may include a polarization axis and an adsorption axis. In this case, the adsorption axis of the second polarizing layer 170 may be substantially parallel to the adsorption axis of the first polarizing layer 140. The second polarizing layer 170 may have a thickness of about 15 μm to about 30 μm.

The second protection layer 180 may locate on the second polarizing layer 170, and may support or protect the second polarizing layer 170. For example, the second protection layer 180 may include triacetyl cellulose, cyclo-olefin polymer, polyethyleneterephthalate, polypropylene, polycarbonate, polysulfone and/or polymethyl methacrylate. The second protection layer 180 may have a relatively large thickness of about 20 μm to about 80 μm. The second protection layer 180 may have a relatively small thickness below about 20 μm, so that the polarization structure 100 may have a reduced thickness.

A reflection of a light incident from an outside (hereinafter, referred to as "external light") may be substantially prevented or reduced by the polarization structure 100. When the polarization structure 100 is disposed on the display panel, a light generated in the display panel may pass through the polarization structure 100. Each of the adhesive layer 110, a first protection layer 130 and the second protection layer 180 may be optically isotropic, so that the adhesive layer 110, the first protection layer 130 and the second protection layer 180 may not substantially change polarization characteristics of the light. The light generated from the display panel may not be polarized initially, and thus the polarization characteristic of the light may not be changed, when it passes through the retardation layer 120. Then, when the light passes through the first polarizing layer 140, the light may be converted into about 45 degrees linearly polarized light according to the polarization axis of the first polarizing layer 140. When the linearly polarized light passes through the first uniaxial optical compensation layer 150, the 45 degrees linearly polarized light may be converted into a left-circularly polarized light. When the left-circularly polarized light passes through the second uniaxial optical compensation layer 160, the left-circularly polarized light may be converted into the about 45 degrees linearly polarized light. The polarization axis of the second polarizing layer 170 may be substantially the same as that of the 45 degrees linearly polarized light, such that the about 45 degrees linearly polarized light may pass through the second polarizing layer 170. Accordingly, the light generated from the display panel may pass through the polarization structure 100.

When the light generated from the display panel emits along a lateral direction rather than a front direction, green color of light may be emitted more than red color of light and blue color of light, a side color shift phenomenon of the display device may be reduced. Meanwhile, the external light may pass through the polarization structure 100 from the outside, and then the external light may be reflected toward the polarization structure 100 by the display panel. For example, when the external light passes through the second polarizing layer 170, the external light may be converted into about 45 degrees linearly polarized light. When the 45 degrees linearly polarized light passes through the second uniaxial optical compensation layer 160, the about 45 degrees linearly polarized light may be converted into a circularly polarized light. When the circularly polarized light passes through the first uniaxial optical compensation layer 150, the circularly polarized light may be converted into the about 45 degrees linearly polarized light. The polarization axis of the first polarizing layer 140 may be substantially the same as that of the about 45 degrees linearly polarized light, so that the linearly polarized light may pass through the first polarizing layer 140. When the linearly polarized light passes through the retardation layer 120, the polarized light may be converted into a left circularly polarized light. In case that the left circularly polarized light is reflected on the display panel, the left circularly polarized light may be converted into a right circularly polarized light. When the right circularly polarized light passes through the retardation layer 120, the right circularly polarized light may be converted into an about −45 degrees linearly polarized light. When the about −45 degrees linearly polarized light incidents into the first polarizing layer 140, a polarization axis of the first polarizing layer 140 may be substantially perpendicular to the polarization axis of the −45 degrees linearly polarized light. Therefore, the −45 degrees linearly polarized light may not pass through the first polarizing layer 140. Accordingly, the external light reflected on the display panel may not pass through the polarization structure 100, such that a contrast ratio of images displayed by the display device may be improved by the polarization structure 100.

The polarization structure 100 may substantially prevent or reduce the reflection of the external light to improve the contrast ratio, and may substantially prevent or reduce the side color shift phenomenon of the display device. The polarization structure 100 may include the coatable retardation layer 120 and the coatable second uniaxial optical compensation layer 160. Thus, an additional adhesive layer for holding the first uniaxial optical compensation layer 150 with the second uniaxial optical compensation layer 160 may be omitted. Additionally, the coatable retardation layer 120 and the coatable second uniaxial optical compensation layer 160 may have smaller thicknesses than those of the conventional retardation layer and the conventional O-plate. Accordingly, the polarization structure 100 may have a simplified structure while ensuring a relatively small thickness.

Figure 2:
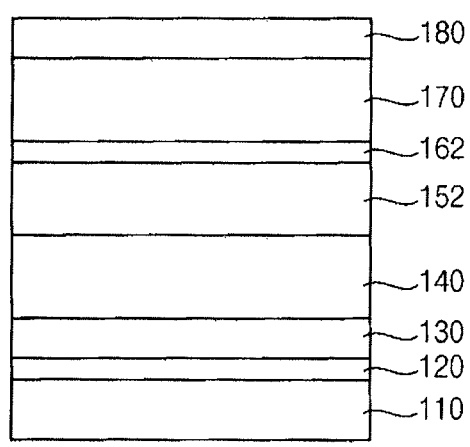
FIG. 2 is a cross-sectional view illustrating a polarization structure in accordance with one embodiment.

FIG. 2 is a cross-sectional view illustrating a polarization structure in accordance with one embodiment.

Referring to FIG. 2, a polarization structure 102 may include an adhesive layer 110, a retardation layer 120, a first protection layer 130, a first polarizing layer 140, a first uniaxial optical compensation layer 152, a second uniaxial optical compensation layer 162, a second polarizing layer 170, a second protection layer 180, etc. As for the polarization structure 102 illustrated in FIG. 2, the adhesive layer 110, the retardation layer 120, the first protection layer 130, the first polarizing layer 140, the second polarizing layer 170 and the second protection layer 180 may be substantially the same as or substantially similar to those of the polarization structure 100 described with reference to FIG. 1, and thus detailed descriptions thereof will be omitted or simplified.

The adhesive layer 110 may fix the polarization structure 102 on a display panel (not illustrated) of a display device, and may have a thickness of about 5 μm to about 25 μm. The retardation layer 120 may be disposed on the adhesive layer 110, and may be coated on the adhesive layer 110. The retardation layer 120 may include an inverse wavelength dispersion type retardation film. In the inverse wavelength dispersion type retardation film, a phase difference may be substantially proportional to a wavelength of an incident light, so that a desirable phase difference may be obtained in a relatively large range of a wavelength of the incident light. The retardation layer 120 may be coatable on the adhesive layer 110, such that the retardation layer 120 may have a relatively small thickness of about 0.1 μm to about 5.0 μm.

The first protection layer 130 may be positioned on the retardation layer 120 to protect or support the first polarizing layer 140. The first polarizing layer 140 may be disposed on the first protection layer 130 to thereby allow a polarization component of the incident light having a specific direction to pass therethrough.

The first uniaxial optical compensation layer 152 may be disposed on the first polarizing layer 140. The first uniaxial optical compensation layer 152 may include a C-plate. Thus, the first uniaxial optical compensation layer 152 may convert a linearly polarized light into a circularly polarized light or to convert a circularly polarized light into a linearly polarized light. When refractive indices of the C-plate in the X-axis direction, the Y-axis direction and the Z-axis direction are respectively defined as nX, nY and nZ, the C-plate may satisfy an equation of nX=nY≠nZ. That is, the C-plate may have a uniaxial anisotropy, and an optical axis of the C-plate may be substantially parallel to the Z-axis direction. For example, the C-plate may include cyclo-olefin copolymer, triacetyl cellulose, polycarbonate and/or cyclo-olefin polymer, and may have a relatively large thickness of about 10 μm to about 50 μm.

The second uniaxial optical compensation layer 162 may be disposed on the first uniaxial optical compensation layer 152. The second uniaxial optical compensation layer 162 may be coated on the first uniaxial optical compensation layer 152. The second uniaxial optical compensation layer 162 may include a coatable C-plate. When refractive indices of the coatable C-plate in the X-axis direction, the Y-axis direction and the Z-axis direction are respectively defined as nX, nY and nZ, the coatable C-plate may satisfy an equation of nX=nY≠nZ. That is, the coatable C-plate may have a uniaxial anisotropy, and an optical axis of the coatable C-plate may be substantially parallel to the Z-axis direction. For example, the coatable C-plate may include cyclo-olefin copolymer, triacetyl cellulose, polycarbonate and/or cyclo-olefin polymer.

Each of the coatable C-plate and the C-plate may not have a slow axis, so that an alignment between the coatable C-plate and the C-plate may not be a considered. The second uniaxial optical compensation layer 162 may be positioned beneath the first uniaxial optical compensation layer 152. That is, the second uniaxial optical compensation layer 162 may be disposed between the first polarizing layer 140 and the first uniaxial optical compensation layer 152.

The coatable C-plate of the second uniaxial optical compensation layer 162 may be coated on the first uniaxial optical compensation layer 152, such that the second uniaxial optical compensation layer 162 may have a reduced thickness. For example, the second uniaxial optical compensation layer 162 may have a relatively small thickness of about 0.1 µm to about 5.0 µm. The coatable C-plate may easily adhere to the C-plate, and thus an additional adhesive layer for binding the first uniaxial optical compensation layer 152 and the second uniaxial optical compensation layer 162 may not be required.

The second polarizing layer 170 may be disposed on the second uniaxial optical compensation layer 162. The second polarizing layer 170 may allow a polarization component of the incident light having a specific direction to pass therethrough. The second polarizing layer 170 may include a material substantially the same as or substantially similar to that of the first polarizing layer 140. Further, and the second polarizing layer 170 may have a thickness substantially similar to that of the first polarizing layer 140. An adsorption axis of the second polarizing layer 170 may be substantially parallel to an adsorption axis of the first polarizing layer 140. The second protection layer 180 may be disposed on the second polarizing layer 170 to support or protect the second polarizing layer 170.

The polarization structure 102 may substantially prevent or reduce a reflection of an external light to improve a contrast ratio of images. Further, the polarization structure 102 may substantially prevent or reduce a side color shift phenomenon of a display device. That is, the polarization structure 102 may include the coatable C-plate having a relatively small thickness, so that an additional adhesive layer for holding the coatable C-plate with the C-plate may be omitted. Accordingly, the polarization structure 102 may have a relatively small thickness.

Figure 3:
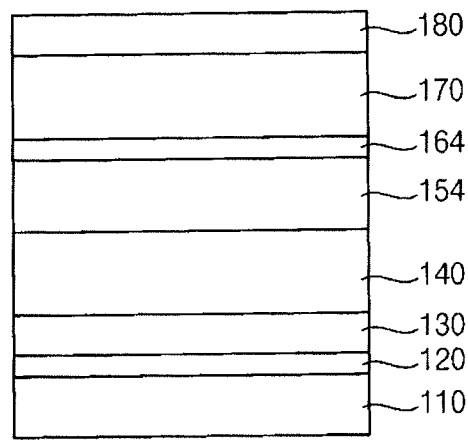
FIG. 3 is a cross-sectional view illustrating a polarization structure in accordance with one embodiment.

FIG. 3 is a cross-sectional view illustrating a polarization structure in accordance with one embodiment.

Referring to FIG. 3, a polarization structure 104 may include an adhesive layer 110, a retardation layer 120, a first protection layer 130, a first polarizing layer 140, a first uniaxial optical compensation layer 154, a second uniaxial optical compensation layer 164, a second polarizing layer 170, a second protection layer 180, etc. In FIG. 3, the adhesive layer 110, the retardation layer 120, the first protection layer 130, the first polarizing layer 140, the second polarizing layer 170 and the second protection layer 180 of the polarization structure 104 may be substantially the same as or substantially similar to those of the polarization structure 100 described with reference to FIG. 1, and thus detailed descriptions thereof will be omitted or simplified.

The adhesive layer 110 may serve to fix the polarization structure 104 on a display panel (not illustrated) of a display device such as an organic light emitting display or a liquid crystal display device, and may have a thickness of about 5 µm to about 25 µm. The retardation layer 120 may be coated on the adhesive layer 110. The retardation layer 120 may include an inverse wavelength dispersion type retardation film. As for the inverse wavelength dispersion type retardation film, a phase difference may be substantially proportional to a wavelength of the incident light, so that a desirable phase difference corresponding to a quarter wavelength of the incident light may be obtained in a relatively large range of the wavelength of the incident light. The retardation layer 120 may be coatable on the adhesive layer 110, so the retardation layer 120 may have a relatively small thickness of about 0.1 µm to about 5.0 µm.

The first protection layer 130 may be disposed on the retardation layer 120 to support or protect the first polarizing layer 140. The first polarizing layer 140 may be located on the first protection layer 130. The first polarizing layer 140 may allow a polarization component of the incident light having a specific direction to pass therethrough. The first polarizing layer 140 may include an adsorption axis and a polarization axis. Hence, a polarization component of the incident light which may vibrate along a direction of the adsorption axis may be dissipated.

The first uniaxial optical compensation layer 154 may be disposed on the first polarizing layer 140. The first uniaxial optical compensation layer 154 may include an A-plate. Therefore, the first uniaxial optical compensation layer 154 may convert a linearly polarized light into a circularly polarized light or may convert a circularly polarized light into a linearly polarized light. When refractive indices of the A-plate in the X-axis direction, the Y-axis direction and the Z-axis direction are respectively defined as nX, nY and nZ, the A-plate may satisfy an equation of nX≠nY=nZ. That is, the A-plate may have a uniaxial anisotropy, and an optical axis of the A-plate may be substantially perpendicular to the Z-axis direction. For example, the A-plate may include cyclo-olefin copolymer, triacetyl cellulose, polycarbonate and/or cyclo-olefin polymer, and may have a relatively large thickness of about 10 µm to about 50 µm.

The second uniaxial optical compensation layer 164 may be disposed on the first uniaxial optical compensation layer 154. The second uniaxial optical compensation layer 164 may include a coatable A-plate. Namely, the second uniaxial optical compensation layer 164 may be disposed on the first uniaxial optical compensation layer 154. When refractive indices of the coatable A-plate in the X-axis direction, the Y-axis direction and the Z-axis direction are respectively indicated by nX, nY and nZ, the coatable A-plate may satisfy an equation of nX≠nY=nZ. That is, the coatable A-plate may have a uniaxial anisotropy, and an optical axis of the coatable A-plate may be substantially perpendicular to the Z-axis direction. For example, the coatable A-plate may include cyclo-olefin copolymer, triacetyl cellulose, polycarbonate and/or cyclo-olefin polymer. A slow axis of the coatable A-plate may be substantially perpendicular to a slow axis of the A-plate.

The second uniaxial optical compensation layer 164 may include a coatable A-plate. Thus, the second uniaxial optical compensation layer 164 may have a reduced thickness. For example, the second uniaxial optical compensation layer 164 may have a relatively small thickness of about 0.1 µm to about 5.0 µm. The coatable A-plate may easily adhere to the A-plate, so that an additional adhesive layer for binding the second uniaxial optical compensation layer 164 and the first uniaxial optical compensation layer 154 may not be required.

The second polarizing layer 170 may be disposed on the second uniaxial optical compensation layer 164 to allow a polarization component of the incident light having a specific direction to pass therethrough. The second polarizing layer 170 may include a material substantially the same as or substantially similar to a material of the first polarizing layer 140. The second polarizing layer 170 may have a thickness substantially similar to a thickness of the first polarizing layer 140. An adsorption axis of the second polarizing layer 170 may be substantially parallel to the adsorption axis of the first polarizing layer 140. The second protection layer 180 may be disposed on the second polarizing layer 170 to support or protect the second polarizing layer 170.

The polarization structure 104 may substantially prevent or reduce a reflection of an external light to improve a contrast ratio, and also may substantially prevent or reduce a side color shift phenomenon of a display device. Since the polarization structure 104 may include the coatable A-plate, an additional adhesive layer for holding the coatable A-plate with the A-plate may be omitted. Accordingly, the polarization structure 104 may have a relatively small thickness, FIG. 4 is a cross-sectional view illustrating a polarization structure in accordance with one embodiment.

Figure 4:
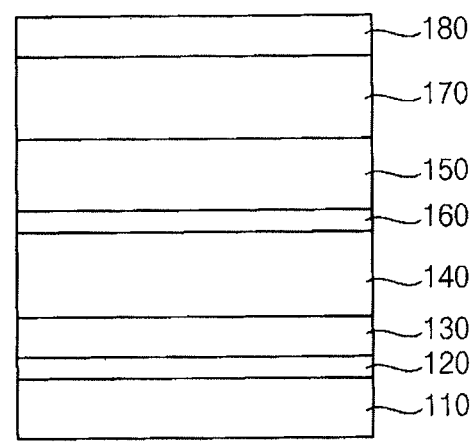
FIG. 4 is a cross-sectional view illustrating a polarization structure in accordance with one embodiment.

Referring to FIG. 4, a polarization structure 106 may include an adhesive layer 110, a retardation layer 120, a first protection layer 130, a first polarizing layer 140, a first uniaxial optical compensation layer 150, a second uniaxial optical compensation layer 160, a second polarizing layer 170, a second protection layer 180, etc. As for the polarization structure 106 illustrated in FIG. 4, the adhesive layer 110, the retardation layer 120, the first protection layer 130, the first polarizing layer 140, the second polarizing layer 170 and the second protection layer 180 may be substantially the same as or substantially similar to those of the polarization structure 100 described with reference to FIG. 1, and thus detailed descriptions thereof will be omitted or simplified.

The adhesive layer 110 may fix the polarization structure 106 to a display panel (not illustrated) of a display device, and may have a thickness of about 5 μm to about 25 μm. The retardation layer 120 may be disposed on the adhesive layer 110. The retardation layer 120 may include an inverse wavelength dispersion type retardation film. In the inverse wavelength dispersion type retardation film, a phase difference may be substantially proportional to a wavelength of the incident light. The first protection layer 130 may be located on the retardation layer 120 to support or protect the first polarizing layer 140. The first polarizing layer 140 may be disposed on the first protection layer 130 so as to allow a polarization component of the incident light having a specific direction to pass therethrough.

The second uniaxial optical compensation layer 160 may be disposed on the first polarizing layer 140. The second uniaxial optical compensation layer 160 may include a coatable O-plate. When refractive indices of the coatable O-plate in the X-axis direction, the Y-axis direction and the Z-axis direction are denoted as nX, nY and nZ, the coatable O-plate may satisfy an equation of nX≠nY≠nZ. In case that the second uniaxial optical compensation layer 160 may include the coatable O-plate, an optical axis of the coatable O-plate may be neither substantially perpendicular to nor substantially parallel to the z-axis direction. For example, the coatable O-plate may include cyclo-olefin copolymer, triacetyl cellulose, polycarbonate and/or cyclo-olefin polymer.

Because the second uniaxial optical compensation layer 160 may be coated on the first polarizing layer 140, the polarization structure 106 may have a reduced thickness. For example, the second uniaxial optical compensation layer 160 may have a thickness of about 0.1 μm to about 5.0 μm.

The first uniaxial optical compensation layer 150 may be positioned on the second uniaxial optical compensation layer 160. The first uniaxial optical compensation layer 150 may include O-plate, and may convert a linearly polarized light into a circularly polarized light or to convert a circularly polarized light into a linearly polarized light. When refractive indices of the O-plate in the X-axis direction, the Y-axis direction and the Z-axis direction are defined as nX, nY and nZ, the O-plate may satisfy an equation of nX≠nY≠nZ. A slow axis of the coatable O-plate may be substantially perpendicular to a slow axis of the O-plate. For example, the first uniaxial optical compensation layer 150 may include cyclo-olefin copolymer, triacetyl cellulose, polycarbonate, cyclo-olefin polymer, etc. and may have a relatively large thickness of about 10 μm to about 50 μm. The first uniaxial optical compensation layer 150 may be easily adhered onto the second uniaxial optical compensation layer 160, such that an additional adhesive layer for holding the first uniaxial optical compensation layer 150 with the second uniaxial optical compensation layer 160 may not be required.

The second polarizing layer 170 may be disposed on the first uniaxial optical compensation layer 150. The second polarizing layer 170 may allow a polarization component of the incident light having a specific direction to pass therethrough. A polarization axis of the second polarization layer 170 may be substantially parallel to a polarization axis of the first polarization layer 140. The second protection layer 180 may be disposed on the second polarizing layer 170 to support or protect the second polarizing layer 170.

The polarization structure 106 may substantially prevent or reduce a reflection of an external light to improve a contrast ratio, and also may substantially prevent or reduce a side color shift phenomenon. In comparison with the polarization structure 100 described with reference to FIG. 1, the polarization structure 106 may include the second uniaxial optical compensation layer 160 disposed between the first uniaxial optical compensation layer 150 and the first polarizing layer 140. Although the location of the second uniaxial optical compensation layer 160 may be switched, the polarization structure 106 may perform substantially the same optical function as the polarization structure 100. Accordingly, the polarization structure 106 may have a smaller thickness than the conventional polarization structure, and may effectively prevent or reduce a side color shift phenomenon of a display device.

Figure 5:
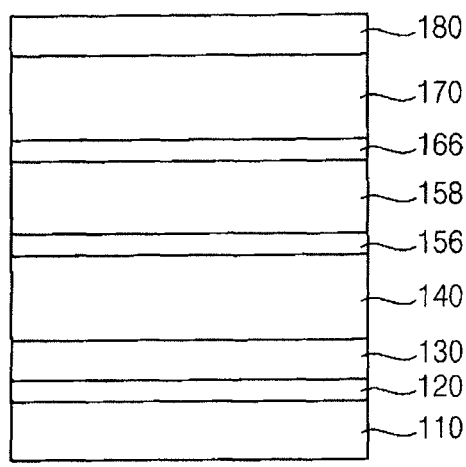
FIG. 5 is a cross-sectional view illustrating a polarization structure in accordance with one embodiment.

FIG. 5 is a cross-sectional view illustrating a polarization structure in accordance with one embodiment.

Referring to FIG. 5, a polarization structure 108 may include an adhesive layer 110, a retardation layer 120, a first protection layer 130, a first polarizing layer 140, a first uniaxial optical compensation layer 156, a transparent layer 158, a second uniaxial optical compensation layer 166, a second polarizing layer 170, a second protection layer 180, etc. In FIG. 5, the adhesive layer 110, the retardation layer 120, the first protection layer 130, the first polarizing layer 140, the second polarizing layer 170 and the second protection layer 180 may be substantially the same as or substantially similar to those described with reference to FIG. 1, and thus detailed descriptions thereof will be omitted or simplified.

The adhesive layer 110 may fix the polarization structure 108 on a display panel (not illustrated), and may have a thickness of about 5 μm to about 25 μm. The retardation layer 120 including an inverse wavelength dispersion type retardation film may be disposed on the adhesive layer 110. The first protection layer 130 may be positioned on the retardation layer 120 to may support or protect the first polarizing layer 140. The first polarizing layer 140 may be located on the first protection layer 130. The first polarizing layer 140 may have a polarization axis and an adsorption axis. The first polarizing layer 140 may allow a polarization component of the incident light having a direction of the polarization axis to pass therethrough.

The first uniaxial optical compensation layer 156 may be disposed on the first polarizing layer 140. The first uniaxial optical compensation layer 156 may include a coatable O-plate. When refractive indices of the coatable O-plate in the X-axis direction, the Y-axis direction and the Z-axis direction are defined as nX, nY and nZ, the coatable O-plate may satisfy an equation of nX≠nY≠nZ. For example, the first uniaxial optical compensation layer 156 may include cyclo-olefin copolymer, triacetyl cellulose, polycarbonate, cyclo-olefin polymer, etc.

The transparent layer 158 may be positioned on the first uniaxial optical compensation layer 156. The transparent layer 158 may include an optically isotropic film which may not substantially change polarization characteristics of a light incident thereto.

The second uniaxial optical compensation layer 166 may be coated on the transparent layer 158. The second uniaxial optical compensation layer 166 may include a material substantially the same as or substantially similar to that of the first uniaxial optical compensation layer 156. Further, the second uniaxial optical compensation layer 166 may have a thickness substantially the same as or substantially similar to that of the first uniaxial optical compensation layer 156. A slow axis of the second uniaxial optical compensation layer 166 may be substantially perpendicular to a slow axis of the first uniaxial optical compensation layer 156.

Since each of the first uniaxial optical compensation layer 156 and the second uniaxial optical compensation layer 166 may include a coatable O-plate, the first and second uniaxial optical compensation layers 156 and 166 may have reduced thicknesses. For example, each of the first and second uniaxial optical compensation layers 156 and 166 may have a relative small thickness of about 0.1 μm to about 0.5 μm.

The second polarizing layer 170 may be disposed on the second uniaxial optical compensation layer 166. In this case, the adsorption axis of the second polarizing layer 170 may be substantially parallel to the adsorption axis of the first polarizing layer 140. The second protection layer 180 may be disposed on the second polarizing layer 170 to support or protect the second polarizing layer 170.

The polarization structure 108 may include the coatable first uniaxial optical compensation layer 156 and the coatable second uniaxial optical compensation layer 166. Therefore, additional adhesive layers may be omitted, and thus the polarization structure 108 may have a simplified structure and a reduced thickness. The polarization structure 108 may substantially prevent or reduce a reflection of an external light to improve a contrast ratio, and also may prevent or reduce a side color shift phenomenon.

Figure 6:
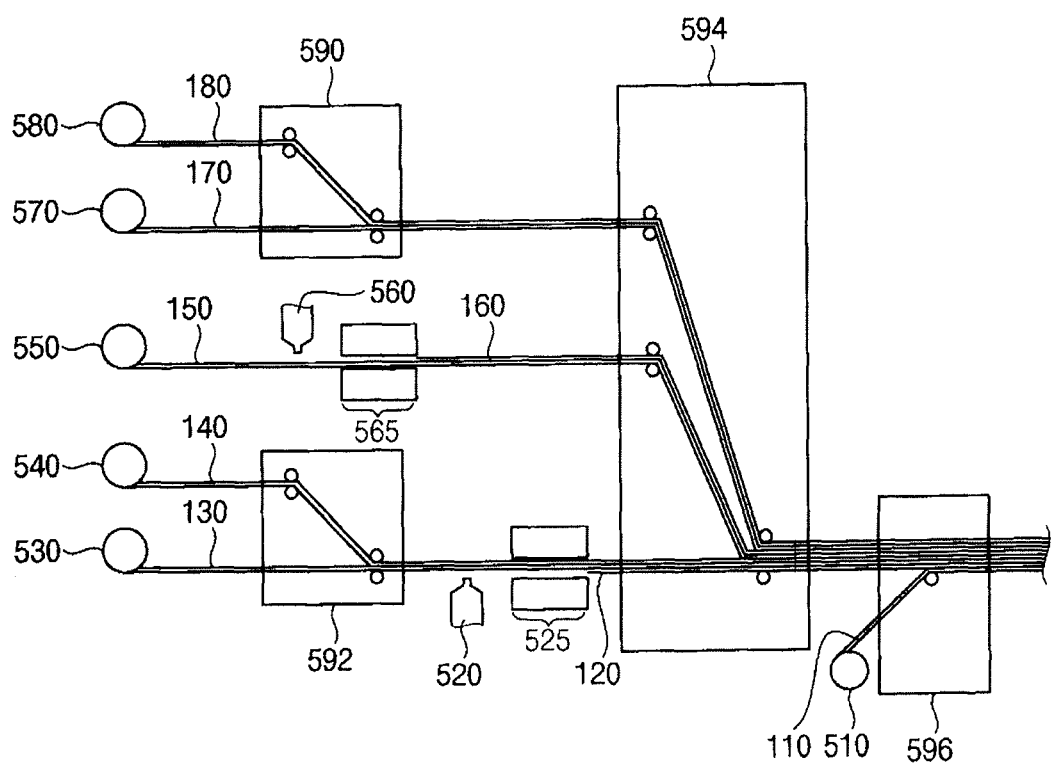
FIG. 6 is a cross-sectional view illustrating a method of manufacturing a polarization structure using a polarization structure manufacturing apparatus in accordance with one embodiment.

FIG. 6 is a cross-sectional view illustrating a method of manufacturing a polarization structure using a polarization structure manufacturing apparatus in accordance with one embodiment.

Referring to FIG. 6, the polarization structure manufacturing apparatus may include an adhesive layer providing part 510, a first coater 520, a first dry zone 525, a first protection layer providing part 530, a first polarizing layer providing part 540, a first uniaxial optical compensation layer providing part 550, a second coater 560, a second dry zone 565, a second polarizing layer providing part 570, a second protection layer providing part 580, a first laminating part 590, a second laminating part 592, a third laminating part 594, a fourth laminating part 596, etc.

The second protection layer providing part 580 may provide the first laminating part 590 with a second protection layer 180 that may be rolled on a roller. The second polarizing layer providing part 570 may provide the first laminating part 590 with a second polarizing layer 170 that may be rolled on a roller. When a direction, in which each of the layers is rolled, is referred to as a machine direction (MD), a direction of a polarization axis of the second polarizing layer 170 may have the angle of about 45 degrees relative to the machine direction.

The first laminating part 590 may laminate the second polarizing layer 170 with the second protection layer 180, and the third laminating part 594 may receive the laminated second polarizing layer 170 and second protection layer 180. Therefore, the second polarizing layer 170 may be supported by the second protection layer 180, so that a deformation of the second polarizing layer 170 may be reduced or substantially prevented.

The first uniaxial optical compensation layer providing part 550 may provide the second coater 560 with a first uniaxial optical compensation layer 150 that may be rolled on a roller. The first uniaxial optical compensation layer 150 may include an O-plate. In this case, a slow axis of the first uniaxial optical compensation layer 150 may be substantially perpendicular to the machine direction. The second coater 560 may drop a coating solution to form a preliminary second uniaxial optical compensation layer on the first uniaxial optical compensation layer 150, and then the preliminary second uniaxial optical compensation layer may be dried in the second dry zone 565 to form the second optical compensation layer 160.

The second uniaxial optical compensation layer 160 may include a coatable O-plate. An ultraviolet ray may be irradiated in the second dry zone 565, so that the second uniaxial optical compensation layer 160 may have a slow axis substantially parallel to the machine direction. That is, the slow axis of the first uniaxial optical compensation layer 150 may be substantially perpendicular to the slow axis of the second uniaxial optical compensation layer 160. The third laminating part 594 may receive the first and the second uniaxial optical compensation layers 150 and 160.

The first protection layer providing part 530 may provide the second laminating part 592 with a first protection layer 130 that may be rolled on a roller. The first polarizing layer providing part 540 may provide the second laminating part 592 with a first polarizing layer 140 that may be rolled on a roller. A direction of a polarization axis of the first polarizing layer 140 may have the angle of about 45 degrees relative to the machine direction. The second laminating part 592 may laminate the first polarizing layer 140 and the first protection layer 130, and the first coater 520 may receive the laminated first polarizing layer 140 and first protection layer 130. Therefore, the first polarizing layer 140 may be supported by the first protection layer 130, so that a deformation of the first polarizing layer 140 may be reduced or substantially prevented.

The first coater 520 may drop a coating solution to form a preliminary retardation layer on the first protection layer 130, and then the preliminary retardation layer may be dried in the second dry zone 525 to form the retardation layer 120. For example, an ultraviolet ray (UV) may be irradiated in the first dry zone 525. The third laminating part 594 may receive the retardation layer 120, the first protection layer 130 and the first polarizing layer 140.

The third laminating part 594 may laminate the retardation layer 120, the first protection layer 130, the first polarizing layer 140, the first uniaxial optical compensation layer 150, the second uniaxial optical compensation layer 160, the second polarizing layer 170 and the second protection layer 180.

The adhesive layer providing part 510 may provide the fourth laminating part 596 with an adhesive layer 110 that may be rolled on a roller. The fourth laminating part 596 may laminate the adhesive layer 110 on the retardation layer 120 to complete the polarization structure.

The polarization structure including the first uniaxial optical compensation layer 150 and the second uniaxial optical compensation layer 160 may be manufactured by using the second coater 560 and the second dry zone 565. The slow axis of the first uniaxial optical compensation layer 150 may be substantially perpendicular to the slow axis of the second uniaxial optical compensation layer 160. The polarization structure may have a simplified structure and a relatively small thickness to substantially prevent or reduce a side color shift phenomenon.

Although the method with reference to FIG. 6 is used to obtain the polarization structure 100 as illustrated in FIG. 1, the present disclosure is not limited thereto. The method may be used to obtain the polarization structures 102, 104, 106 and 108 described with reference to FIGS. 2 to 5.

Figure 7:
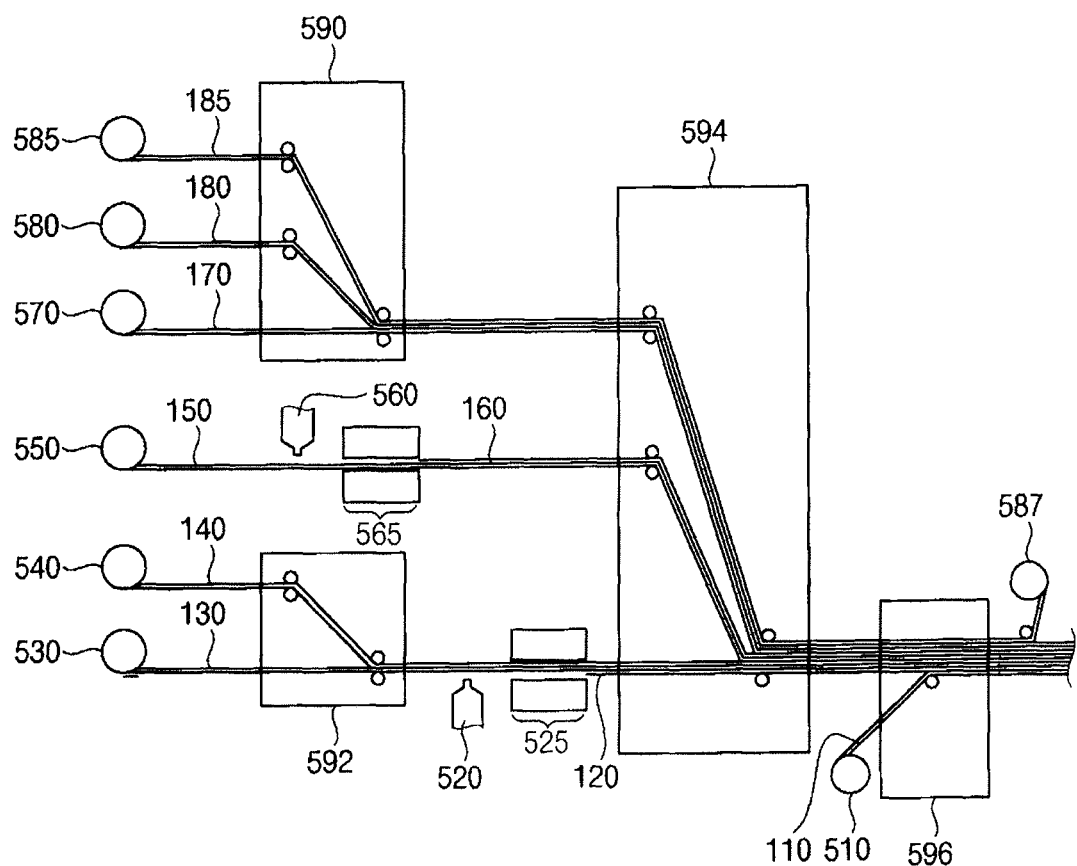
FIG. 7 is a cross-sectional view illustrating a method of manufacturing a polarization structure using a polarization structure manufacturing apparatus in accordance with one embodiment.

FIG. 7 is a cross-sectional view illustrating a method of manufacturing a polarization structure using a polarization structure manufacturing apparatus in accordance with one embodiment.

Referring to FIG. 7, the polarization structure manufacturing apparatus may include an adhesive layer providing part 510, a first coater 520, a first dry zone 525, a first protection layer providing part 530, a first polarizing layer providing part 540, a first uniaxial optical compensation layer providing part 550, a second coater 560, a second dry zone 565, a second polarizing layer providing part 570, a second protection layer providing part 580, a base layer providing part 585, a base layer separating part 587, a first laminating part 590, a second laminating part 592, a third laminating part 594, a fourth laminating part 596, etc.

The second protection layer providing part 580 may provide the first laminating part 590 with a second protection layer 180 that may be rolled on a roller. The second polarizing layer providing part 570 may provide the first laminating part 590 with a second polarizing layer 170 that may be rolled on a roller. The base layer providing part 585 may provide the first laminating part 590 with a base layer 185. The first laminating part 590 may laminate the second polarizing layer 170, the second protection layer 180 and the base layer 185, and may provide the third laminating part 594 with the laminated layers. The second protection layer 180 may have a thickness below about 20 um, and the base layer 185 may have a thickness substantially enough to ensure a mechanical strength. Therefore, the second polarizing layer 170 may be supported by the second protection layer 180 and the base layer 185, so that a deformation of the second polarizing layer 170 may be substantially prevented or reduced.

Processes for forming the first uniaxial optical compensation layer 150 and the second uniaxial optical compensation layer 160 may be substantially the same as or substantially similar to the processes described with reference to FIG. 6, and thus detailed descriptions thereof will be omitted or simplified.

The third laminating part 594 may laminate the retardation layer 120, the first protection layer 130, the first polarizing layer 140, the first uniaxial optical compensation layer 150, the second uniaxial optical compensation layer 160, the second polarizing layer 170, the second protection layer 180 and the base layer 185. The fourth laminating part 596 may laminate an adhesive layer 110 on the laminated retardation layer 120. The base layer separating part 587 may separate the base layer 185 from the laminated layers to form the polarization structure.

The polarization structure including the first uniaxial optical compensation layer 150 and the second uniaxial optical compensation layer 160 may be manufactured by using the second coater 560 and the second dry zone 565. The slow axis of the first uniaxial optical compensation layer 150 may be substantially perpendicular to the slow axis of the second uniaxial optical compensation layer 160. Additionally, the base layer 185 may be laminated, so that the second protection layer 180 having a thickness below about 20 um, and the base layer 185 may substantially prevent a deformation of the second polarizing layer 170 during the manufacturing process. Accordingly, the polarization structure may have a simplified structure and a relatively small thickness to substantially prevent or reduce a side color shift phenomenon.

Figure 8:
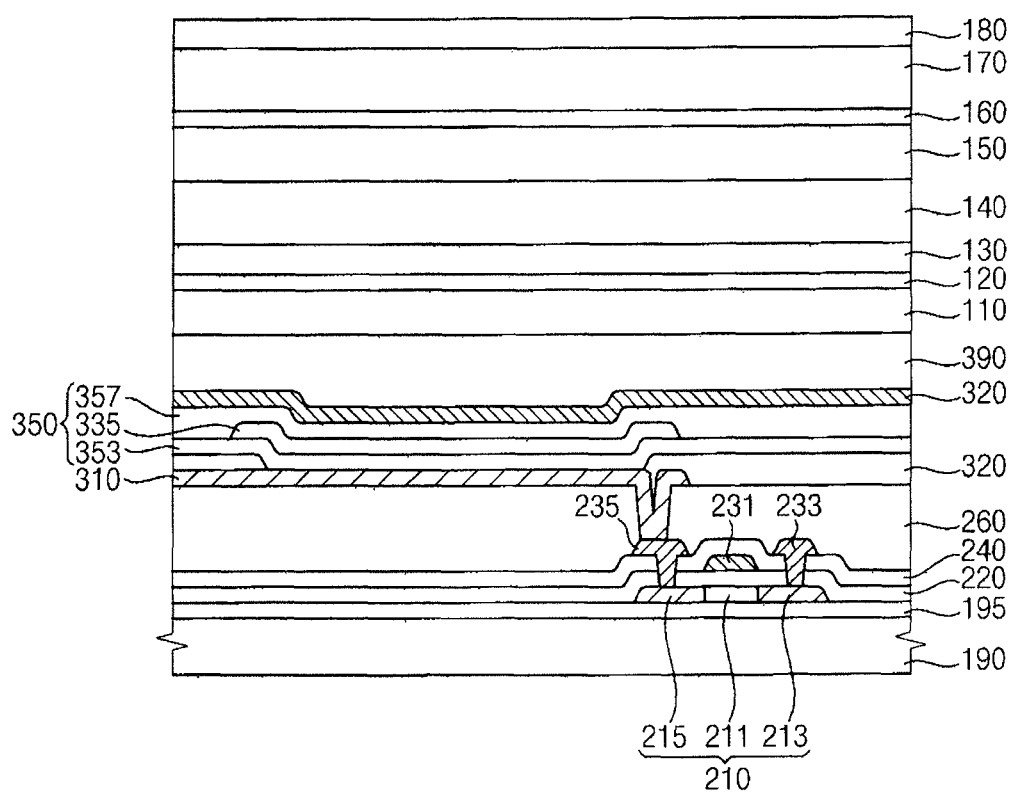
FIG. 8 is a cross-sectional view illustrating an organic light emitting display in accordance with one embodiment.

FIG. 8 is a cross-sectional view illustrating an organic light emitting display in accordance with one embodiment.

Referring to FIG. 8, the organic light emitting display may include an organic light emitting display panel, a polarization structure 100, etc. The organic light emitting display panel may include a first substrate 190, a switching structure 200, a first electrode 310, a light emitting structure 350, a second electrode 320, a second substrate 390, etc.

The first substrate 190 may include a transparent insulating material. For example, the first substrate 190 may include a glass substrate, a quartz substrate, a transparent resin substrate, etc. The first substrate 190 may consist of a flexible substrate. The buffer layer 195 may be disposed on the first substrate 190. The buffer layer 195 may improve a flatness of an upper surface of the first substrate 190, and may substantially prevent metal atoms and/or impurities from diffusing.

When the organic light emitting display has an active matrix type, the switching structure 200 may be disposed between the first substrate 190 and the first electrode 310. The switching structure 200 may include a switching device and at least one of insulation layers.

When the switching device in the switching structure 200 includes the thin film transistor, the switching device may include a semiconductor layer 210, a gate electrode 231, a source electrode 233, a drain electrode 235, etc.

A gate signal may be applied to the gate electrode 231, and a data signal may be applied to the source electrode 233. The drain electrode 235 may electrically contact the first electrode, and the semiconductor layer 210 may electrically contact both the source electrode 233 and the drain electrode 235. The semiconductor layer 210 may a source region 213 contacting the source electrode 233, a drain region 215 contacting the drain electrode 235 and a channel region locating between the source region 213 and the drain region 215.

A gate insulation layer 220 electrically isolating the gate electrode 231 from the semiconductor layer 210 may be disposed on the semiconductor layer 210, and an insulating interlayer 240 may be disposed on the gate insulation layer 220 to cover the gate electrode 231.

In the organic light emitting display described with reference to FIG. 8, the switching device including the thin film transistor may have a top gate structure in which the gate electrode 231 may be disposed on the semiconductor layer 210, however, the configuration of the switching device may not be limited thereto. For example, the switching device may have a bottom gate structure in which the gate electrode 231 may be disposed under the semiconductor layer 210, or may include the oxide semiconductor device having the active layer containing semiconductor oxide.

An insulation layer 260 may be disposed on the insulating interlayer 240 to cover the source electrode 233 and the drain electrode 235. The insulating layer 260 may have a substantially flat upper surface obtained by a planarization process.

When the organic light emitting display uses an organic light emitting display mechanism, the light emitting structure 350 may include at least one organic layer.

Referring to FIG. 8, the light emitting structure 350 may include a hole transfer layer 353, organic light emitting layer 355, electron transfer layer 357, etc. The organic light emitting layer 355 may be positioned on the hole transfer layer 353 in the light emitting region. The organic light emitting layer 355 may include an organic material or a mixture of an organic material and an inorganic material generating at least one of red color of light, green color of light and blue color of light. In some embodiments, the organic light emitting layer 355 includes a stacked structure including light emitting layers for the red color of light, the green color of light, and the blue color of light to generate white color of light.

The first electrode 310 may be disposed between the switching structure 200 and the light emitting structure 350, and the second electrode 320 may be disposed between the light emitting structure 350 and the second substrate 390. A pixel defining layer 330 may be disposed between the switching structure 200 and the light emitting structure 360 in a region where the first electrode 310 may not be disposed. The first electrode 310 may serve as an anode for providing holes into a hole transfer layer 353 of the light emitting structure 350, and the second electrode 320 may serve as a cathode for supplying electrons into an electron transfer layer 357. However, the present disclosure is not limited to the above-described construction. The first electrode 310 and the second electrode 320 may serve as a cathode and an anode, respectively. In this case, an electron transferring layer, an emitting layer, a hole transferring layer and the second electrode 320 may be successively provided on the first electrode 310.

In order to reduce a driving voltage of the organic light emitting display while enhancing luminous efficiency thereof, a hole injection layer (HIL) (not illustrated) may be interposed between the first electrode 310 and the hole transferring layer 353. Additionally, an electron injection layer (EIL) may be disposed between the electron transferring layer 357 and the second electrode 320.

When the light emitting structure 350 includes a plurality of emitting layers generating different colors of light to produce a white light according to some embodiments, the organic light emitting display may additionally include a color filter corresponding to the light emitting structure 350. Alternatively, the color filter may not be required when the light emitting structure 350 includes different luminous materials for generating different color lights in respective color pixel regions.

The second substrate 390 may be disposed on the second electrode 320. The second substrate 390 may include a transparent insulating material such as glass, quartz, a transparent resin, a transparent ceramic, etc. The second substrate 390 may include a flexible substrate.

Referring to FIG. 8, the polarization structure 100 may be disposed on the second substrate 390. The polarization structure 100 may include an adhesive layer 110, a retardation layer 120, a first protection layer 130, a first polarizing layer 140, a first uniaxial optical compensation layer 150, a second uniaxial optical compensation layer 160, a second polarizing layer 170, a second protection layer 180, etc. The polarization structure 100 may be substantially the same as or substantially similar to the polarization structure 100 described with reference to FIG. 1, and thus detailed description thereof will be omitted or simplified.

Although the polarization structure 100 with reference to FIG. 1 is employed in the organic light emitting display illustrated in FIG. 1, the present disclosure is not limited thereto. The organic light emitting display may include at least one of the polarization structures 102, 104, 106 and 108 described with reference to FIGS. 2 to 5.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A polarization structure for an organic light emitting display, comprising:
    a retardation layer configured to create a phase difference between two polarization components of an incident light;
    a first polarizing layer formed over the retardation layer;
    a first uniaxial optical compensation layer formed over the first polarizing layer;
    a second polarizing layer formed over the first uniaxial optical compensation layer; and
    a second uniaxial optical compensation layer formed between the first polarizing layer and the first uniaxial optical compensation layer or between the first and second polarizing layers, wherein the first and second uniaxial optical compensation layers directly contact each other.

2. The polarization structure of claim 1, wherein the first uniaxial optical compensation layer includes an O-plate, wherein the second uniaxial optical compensation layer includes a coatable O-plate, and wherein a direction of a slow axis of the O-plate is substantially perpendicular to a direction of a slow axis of the coatable O-plate.

3. The polarization structure of claim 1, wherein the first uniaxial optical compensation layer includes an A-plate, wherein the second uniaxial optical compensation layer includes a coatable A-plate, and wherein a direction of a slow axis of the A-plate is substantially perpendicular to a direction of a slow axis of the coatable A-plate.

4. The polarization structure of claim 1, wherein the first uniaxial optical compensation layer includes a C-plate and wherein the second uniaxial optical compensation layer includes a coatable C-plate.

5. The polarization structure of claim 1, further comprising a transparent layer disposed between the first and second uniaxial optical compensation layers,
    wherein each of the first and second uniaxial optical compensation layers includes a coatable plate.

6. The polarization structure of claim 1, wherein the retardation layer includes a coatable inverse wavelength dispersion type retardation film, and is configured to create a phase difference corresponding to a quarter wavelength of the incident light.

7. The polarization structure of claim 1, wherein the second uniaxial optical compensation layer has a thickness of about 0.1 µm to about 0.5 µm, and wherein the retardation layer has a thickness of about 0.1 µm to about 0.5 µm.

8. The polarization structure of claim 1, wherein a polarization axis of the first polarizing layer and a polarization axis of the second polarizing layer are substantially parallel to each other.

9. The polarization structure of claim 1, wherein the retardation layer is formed of at least one of the following: cyclo-olefin polymer, triacetyl cellulose, polycarbonate, and cyclo-olefin copolymer.

10. The polarization structure of claim 1, wherein each of the first and second uniaxial optical compensation layers is formed of at least one of the following: cyclo-olefin polymer, triacetyl cellulose, polycarbonate, and cyclo-olefin copolymer.

11. The polarization structure of claim 1, further comprising:
an adhesive layer disposed on a first surface of the retardation layer;
a first protection layer disposed between a second surface of the retardation layer and the first polarizing layer, wherein the second surface is opposing the first surface; and
a second protection layer disposed on the second polarizing layer.

12. The polarization structure of claim 11, wherein each of the first and second protection layers has a thickness less than about 20 μm.

13. An organic light emitting display comprising:
an organic light emitting display panel including a substrate, a switching structure, a first electrode, a light emitting structure and a second electrode; and
a polarization structure including,
a retardation layer configured to create a phase difference between two polarization components of an incident light;
a first polarizing layer formed over the retardation layer;
a first uniaxial optical compensation layer formed over the first polarizing layer;
a second polarizing layer disposed over the first uniaxial optical compensation layer; and
a second uniaxial optical compensation layer disposed between the first polarizing layer and the first uniaxial optical compensation layer or between the first and second polarizing layers, wherein the first and second uniaxial optical compensation layers directly contact each other.

14. The organic light emitting display of claim 13, wherein the first uniaxial optical compensation layer includes an O-plate, wherein the second uniaxial optical compensation layer includes a coatable O-plate, and wherein a direction of a slow axis of the O-plate is substantially perpendicular to a direction of a slow axis of the coatable O-plate.

15. The organic light emitting display of claim 13, wherein the first uniaxial optical compensation layer includes an A-plate, wherein the second uniaxial optical compensation layer includes a coatable A-plate, and wherein a direction of a slow axis of the A-plate is substantially perpendicular to a direction of a slow axis of the coatable A-plate.

16. The organic light emitting display of claim 13, wherein the first uniaxial optical compensation layer includes a C-plate, and wherein the second uniaxial optical compensation layer includes a coatable C-plate.

17. The organic light emitting display of claim 13, wherein the retardation layer includes a coatable inverse wavelength dispersion type retardation film, and is configured to create a phase difference corresponding to a quarter wavelength of the incident light.

18. The organic light emitting display of claim 13, wherein a polarization axis of the first polarizing layer and a polarization axis of the second polarizing layer are substantially parallel to each other, wherein the second uniaxial optical compensation layer has a thickness of about 0.1 μm to about 0.5 μm, and wherein the retardation layer has a thickness of about 0.1 μm to about 0.5 μm.

19. The organic light emitting display of claim 13, further comprising:
an adhesive layer disposed on a first surface of the retardation layer;
a first protection layer disposed between a second surface of the retardation layer and the first polarizing layer, wherein the second surface is opposing the first surface; and
a second protection layer disposed on the second polarizing layer.

20. The polarization structure of claim 1, wherein the first polarizing layer is formed between 1) the retardation layer and 2) one of the first and second uniaxial optical compensation layers.

21. The polarization structure of claim 1, wherein the first uniaxial optical compensation layer directly contacts the first polarizing layer.

* * * * *